US008168539B2

(12) United States Patent
Sugiura et al.

(10) Patent No.: US 8,168,539 B2
(45) Date of Patent: May 1, 2012

(54) METHOD FOR FORMING TUNGSTEN FILM AT A SURFACE OF A PROCESSING TARGET MATERIAL, FILM-FORMING APPARATUS, STORAGE MEDIUM AND SEMICONDUCTOR DEVICE WITH A TUNGSTEN FILM

(75) Inventors: Masahito Sugiura, Yamanashi (JP); Yasutaka Mizoguchi, Tokyo (JP); Yasushi Aiba, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 419 days.

(21) Appl. No.: 11/994,339

(22) PCT Filed: Jun. 23, 2006

(86) PCT No.: PCT/JP2006/312606
§ 371 (c)(1),
(2), (4) Date: Jan. 29, 2008

(87) PCT Pub. No.: WO2007/004443
PCT Pub. Date: Jan. 11, 2007

(65) Prior Publication Data
US 2009/0045517 A1      Feb. 19, 2009

(30) Foreign Application Priority Data

Jul. 1, 2005   (JP) ................................. 2005-194170

(51) Int. Cl.
*H01L 21/44*   (2006.01)
(52) U.S. Cl. .......................... 438/685; 438/656; 438/683
(58) Field of Classification Search .................. 438/656, 438/683, 685
See application file for complete search history.

(56) References Cited

U.S. PATENT DOCUMENTS

| 6,303,480 | B1 * | 10/2001 | Desai et al. .................... 438/584 |
| 6,787,466 | B2 * | 9/2004 | Herner ........................... 438/685 |
| 6,924,223 | B2 * | 8/2005 | Yamasaki et al. ............. 438/622 |
| 6,982,226 | B1 * | 1/2006 | Merchant et al. ............. 438/648 |
| 7,427,426 | B2 * | 9/2008 | Hatano et al. ................. 427/250 |
| 2001/0001297 | A1 * | 5/2001 | Wang et al. .................... 438/592 |
| 2003/0013300 | A1 * | 1/2003 | Byun ............................. 438/680 |
| 2005/0032364 | A1 * | 2/2005 | Okubo et al. ................. 438/680 |

(Continued)

FOREIGN PATENT DOCUMENTS

JP   2002 38271   2/2002

(Continued)

*Primary Examiner* — David Vu
*Assistant Examiner* — Caleb Henry
(74) *Attorney, Agent, or Firm* — Oblon, Spivak, McClelland, Maier & Neustadt, L.L.P.

(57) ABSTRACT

A tungsten film with a lower specific resistance and a lower fluorine concentration over its boundary with the base barrier layer, which adheres to the barrier layer with a high level of reliability, compared to tungsten films formed through methods in the related art, is formed. The tungsten film is formed through a process in which a silicon-containing gas is delivered to a wafer M placed within a processing container 14 and a process executed after the silicon-containing gas supply process, in which a first tungsten film 70 is formed by alternately executing multiple times, a tungsten-containing gas supply step for supplying a tungsten-containing gas and a hydrogen compound gas supply step for supplying a hydrogen compound gas with no silicon content with a purge step in which an inert gas is supplied into the processing container and/or an evacuation step for evacuating the processing container executed between the tungsten-containing gas supply step and the hydrogen compound gas supply step.

7 Claims, 17 Drawing Sheets

FOREIGN PATENT DOCUMENTS

| | | |
|---|---|---|
| JP | 2003 193233 | 7/2003 |
| JP | 2004 273764 | 9/2004 |
| JP | 2004 277864 | 10/2004 |
| JP | 2005 505690 | 2/2005 |

* cited by examiner

| CLASS | PEELING LEVEL | |
|---|---|---|
| 5B | NO CHANGE | 0% |
| 4B |  | ~5% |
| 3B |  | 5%~15% |
| 2B |  | 15%~35% |
| 1B |  | 35%~65% |
| 0B | | 65%~100% |

| | INITIAL TUNGSTEN FILM | | INITIAL TUNGSTEN FILM + MAIN TUNGSTEN FILM | |
|---|---|---|---|---|
| | 40nm | JIS | 40+260(Total300)nm | JIS |
| RELATED ART |  | 1B |  | 0B |
| PRESENT INVENTION |  | 4B |  | 1B |

METHOD FOR FORMING TUNGSTEN FILM AT A SURFACE OF A PROCESSING TARGET MATERIAL, FILM-FORMING APPARATUS, STORAGE MEDIUM AND SEMICONDUCTOR DEVICE WITH A TUNGSTEN FILM

TECHNICAL FIELD

The present invention relates to a method for forming a tungsten film at a surface of a processing target material such as a semiconductor wafer, a film forming apparatus, a storage medium and a semiconductor device.

BACKGROUND ART

Semiconductor device manufacturing processes normally include a step in which a metal film is formed at the surface of the processing target material such as a semiconductor wafer (hereafter may be simply referred to as a "wafer"). A metal film must be formed when, for instance, forming a wiring pattern at a wafer surface or filling recesses (via holes) between wirings or recesses (contact holes) for substrate contact. The metal film may be a thin film formed by depositing metal or a metal compound such as W (tungsten), WSi (tungsten silicide), WN (tungsten nitride), Ti (titanium), TiN (titanium nitride) or TiSi (titanium silicide).

The resistance of the metal film used for wiring purposes or the like should be as low as possible. The tungsten film among the metal films listed above, which has a particularly low specific resistance and becomes set at low temperature for film formation, is deemed desirable from this viewpoint and, accordingly, it is widely used when filling recesses between wirings and substrate contact recesses.

The tungsten film is usually formed through deposition by using $WF_6$ (tungsten hexafluoride) as a metal base material gas and reducing the metal base material gas with a reducing gas such as hydrogen, silane or difluorosilane. In addition, before forming the tungsten film, a thin, uniform barrier layer to act as a base film, constituted with a TiN film deposited on the wafer surface or a laminated film (TiN/Ti film) constituted with a Ti film and a TiN film deposited on the Ti film, is formed to assure better adhesion of the tungsten film and deter a reaction with the lower wiring metal layer or the substrate. The tungsten film is then deposited over the barrier layer.

In order to assure good filling of recesses or the like with a tungsten film, a hydrogen gas with a lower reducing property than silane is normally used as the reducing gas. The use of a hydrogen gas as the reducing gas in the tungsten film formation may result in the formation of a volcano or a void in a hole (e.g., a contact hole).

FIG. 10 illustrates the mechanism of volcano formation. FIGS. 10A, 10B and 10C show how the reaction occurs in sequence. FIG. 10 indicates that the behavior of fluorine is a significant factor in volcano formation and that $TiF_3$ produced through the reaction with fluorine at the barrier layer moves upward and erupts through the upper layer. More specifically, the fluorine component in the pre-reaction $WF_6$ gas reacts with the barrier layer, and through this reaction, a titanium fluoride, primarily $TiF_3$, is produced (see FIGS. 10A and 10B). This titanium fluoride expands, erupting upward through the barrier layer as a volcano (see FIG. 10C).

In order to prevent such volcano formation, an initial tungsten film to act as a nulcleation layer is formed before depositing a main tungsten film so as to protect the base barrier layer from the attack by the $WF_6$ gas during the formation of the main tungsten film. The pre-reaction $WF_6$ gas must be removed promptly and also, the fluorine concentration in the tungsten film must be controlled so that the fluorine component in the tungsten film does not directly react with the base barrier layer during the formation of the initial tungsten film.

The initial tungsten film may be formed through an atomic layer deposition (ALD) method whereby the $WF_6$ gas and a reducing gas constituted with $B_2H_6$ (diborane) gas are alternately supplied multiple times with a purge step executed between the $WF_6$ gas supply step and the $B_2H_6$ gas supply step (see, for instance, patent reference literature 1). The resistance of the tungsten film deposited through this method is low, with low fluorine concentration in the tungsten film and, accordingly, it is assumed that the formation of a fluorine compound through a reaction with the base metal can be prevented.

Gas supply modes adopted in the related art to supply the individual types of gases during the tungsten film formation are now explained in reference to drawings. FIG. 11A presents an example of a gas supply mode adopted in the related art, and FIG. 11B presents another example of a gas supply mode adopted in the related art. FIG. 11A shows a gas supply mode adopted in the ALD method mentioned earlier, in which a $B_2H_6$ gas is used as the reducing gas. FIG. 11B shows a gas supply mode with a $SiH_4$ gas used as the reducing gas. FIG. 12 illustrates steps through which a hole is filled with a tungsten film formed by adopting either of the gas supply modes shown in FIG. 11.

The following explanation is provided by assuming that the $B_2H_6$ gas is used as the reducing gas (see FIG. 11A). It is to be noted that an Ar gas and an $N_2$ gas to be used as a carrier gas and a purge gas respectively are supplied at constant flow rates and that the processing pressure is sustained at a constant level through the entire processing phase. In addition, a barrier layer 4 is formed over the entire surface of a wafer M, which includes the inner surface of a hole 2, e.g., a contact hole, as shown in FIG. 12A.

First, an initial tungsten film 8 is formed at the wafer M shown in FIG. 12A by alternately supplying the $B_2H_6$ gas and the $WF_6$ gas repeatedly over brief periods. During this process, a purge step is executed to eliminate any residual gas in the container between a $B_2H_6$ gas supply step and the subsequent $WF_6$ gas supply step. The $WF_6$ gas molecule layer absorbed on the wafer surface during the $WF_6$ gas supply step is reduced with the $B_2H_6$ supplied through the subsequent step and a tungsten film constituted with several atomic layers is formed through a single pair of gas supply steps. By repeating the alternating gas supply steps a given number of times, the initial tungsten film 8 with a desired film thickness is formed, as shown in FIG. 12B.

Next, the main tungsten film formation step is executed by simultaneously supplying the $WF_6$ gas and an $H_2$ gas, thereby filling the hole 2 with a main tungsten film 10 deposited as shown in FIG. 12C. In the alternative gas supply mode shown in FIG. 11B, $SiH_4$ (mono-silane) is used in place of $B_2H_6$ (see, for instance, patent reference literature 2). In the alternative gas supply mode, the initial $SiH_4$ gas supply step may be executed over an extended period of time relative to the subsequent other $SiH_4$ gas supply steps and, in such a case, during the initial $SiH_4$ gas supply step, initiation processing for depositing a decomposition intermediate such as $SiH_x$ ($0 \leq x \leq 4$) at the wafer surface is also executed.

(Patent reference literature 1) Japanese Laid Open Patent Publication No. 2002-038271
(Patent reference literature 2) Japanese Laid Open Patent Publication No. 2003-193233

DISCLOSURE OF THE INVENTION

Problems to be Solved by the Invention

As future generations of semiconductor devices with even smaller semiconductor device elements are expected to operate at increasingly higher speed, the contact (via) resistance needs to be lowered by assuring an even lower resistance at the tungsten film and a smaller film thickness for the barrier layer with a relatively high specific resistance. However, if a very thin TiN with a film thickness of 5 nm or less, for instance, is used as the barrier film in tungsten film formation in the related art described above, formation of volcanoes cannot be prevented effectively.

FIG. 13 presents a photographic image of a tungsten film structure achieved by forming the initial tungsten film over a thin TiN/Ti laminated film as explained earlier through the ALD method whereby the $WF_6$ gas and the $B_2H_6$ gas are alternately supplied and then by depositing the main tungsten film over a practical film thickness obtained through an electron microscope. FIG. 13 shows that the smaller film thickness assumed for the barrier layer has resulted in the formation of a volcano. Possible causes of the volcano formation include; failure to provide sufficient protection against a $WF_6$ reaction with insufficient quality of the initial tungsten film formed through the method of the related art and attack on the base barrier layer preceding the formation of the initial tungsten film.

In addition, while the attack on the base barrier layer may be effectively prevented by adopting the ALD method whereby the $WF_6$ gas and the $SiH_4$ gas are alternately supplied, there is an issue to be addressed in that since the initial tungsten film formed to function as a nulcleation layer contains silicon, the specific resistance of the main tungsten film deposited over the initial tungsten film is bound to increase.

While it has been a routine practice in the related art to planarize the tungsten film through etch-back processing after filling contact (via) holes with the tungsten film, the planarization process has come to be executed through CMP processing as a post-process following the contact hole filling step in an increasing number of applications to facilitate further miniaturization and further multilayering in recent years. Also, while the specific resistance of the laminated film constituted with the initial tungsten film formed through the ALD method in the related art by alternately supplying the $WF_6$ gas and the $B_2H_6$ gas and the main tungsten film is sufficiently low, the adhesion with which the laminated film comes into tight contact with the barrier layer constituted of TiN or the like tends to become worse. For this reason, when eliminating the excess tungsten film through the CMP processing mentioned above after executing the tungsten film formation step in the related art, a slurry (abrasive solvent) penetrating the boundary between the tungsten film and the barrier layer due to the stress applied to the wafer from the pad at the CMP device causes separation of the tungsten film from the contact holes.

An object of the present invention, having been completed by addressing the issues discussed above, is to provide a tungsten film formation method and the like, with which a tungsten film with better adhesion with the barrier layer is formed, while deterring volcano formation by keeping the specific resistance to a low level and, more specifically, by reducing the fluorine concentration over the boundary area with the base barrier layer.

Means for Solving the Problems

The object described above is achieved in an aspect of the present invention by providing a tungsten film formation method to be adopted when forming a tungsten film at a surface of a processing target material in an evacuatable processing container, comprising a silicon-containing gas supply process in which a silicon-containing gas is supplied to the processing target material and a first tungsten film formation process executed after the silicon-containing gas supply process, in which a first tungsten film is formed by alternately executing multiple times; a tungsten-containing gas supply step for supplying a tungsten-containing gas and a hydrogen compound gas supply step for supplying a hydrogen compound gas that does not contain silicon with a purge step for purging the processing container by supplying an inert gas therein and/or an evacuation step for evacuating the processing container executed between the tungsten-containing gas supply step and the hydrogen compound gas supply step.

According to the present invention described above, a silicon-containing gas is used in an initiation process (pre-processing process) executed prior to an initial tungsten film formation process and in the subsequent initial tungsten film formation process, an initial tungsten film is formed by alternately supplying the tungsten-containing gas and the hydrogen compound gas with no silicon content multiple times. As a result, the specific resistance of the tungsten film, including the specific resistance of a main tungsten film to be formed subsequently, can be reduced. In addition, since the fluorine concentration over the boundary area with a barrier layer used as a base for the tungsten film is reduced, diffusion of fluorine over the barrier layer or fluorine breakthrough can be deterred. As a result, volcano formation is prevented and the adhesion of the tungsten film with the base barrier layer can be improved.

The method may further comprise a second tungsten film formation process for forming a second tungsten film executed by simultaneously supplying the tungsten-containing gas and a reducing gas onto the first tungsten film. The first tungsten film formation process and the second tungsten film formation process may be executed in a single processing container. In addition, the silicon-containing gas may be any of; mono-silane, di-silane and organic silane.

The hydrogen compound gas with no silicon content may be, for instance, diborane or a phosphine. Alternatively, the hydrogen compound gas with no silicon content may be a hydrogen-diluted diborane gas. The reducing gas may be constituted with, for instance, hydrogen. The tungsten-containing gas may be constituted with $WF_6$. The barrier layer formed at the surface of the processing target material may include, for instance, a TiN film.

The object described above is achieved in another aspect of the present invention by providing a tungsten film formation method to be adopted when forming a tungsten film in an evacuatable processing container, comprising a silicon-containing gas supply process in which a silicon-containing gas is supplied to a processing target material with a contact hole formed therein, a first tungsten film formation process executed after the silicon-containing gas supply process, in which a first tungsten film is formed by alternately executing multiple times; a tungsten-containing gas supply step for supplying a tungsten-containing gas and a hydrogen compound gas supply step for supplying a hydrogen compound gas that does not contain silicon with a purge step for purging the processing container by supplying an inert gas therein and/or an evacuation step for evacuating the processing container executed between the tungsten-containing gas supply step and the hydrogen compound gas supply step, a contact hole filling process in which the contact hole is filled by further forming a second tungsten film over the first tungsten film with the tungsten-containing gas and a reducing gas simultaneously supplied onto the first tungsten film, and a contact plug formation process executed after the second tungsten film is formed, in which a contact plug is formed through chemical-mechanical polishing (e.g., CMP) executed at the surface of the processing target material.

The object described above is further achieved in yet another aspect of the present invention by providing a film forming apparatus comprising an evacuatable processing container, a stage disposed within the processing container on which a processing target material is placed, a heating means for heating the processing target material, a gas supply means capable of supplying at least a silicon/hydrogen containing gas, a tungsten-containing gas and a hydrogen compound gas with no silicon content into the processing container and a control unit that executes a silicon-containing gas supply process in which a silicon-containing gas is supplied to the processing target material via the gas supply means and a first tungsten film formation process executed after the silicon-containing gas supply process, in which a first tungsten film is formed by alternately executing multiple times; a tungsten-containing gas supply step for supplying the tungsten-containing gas via the gas supply means and a hydrogen compound gas supply step for supplying the hydrogen compound gas with no silicon content via the gas supply means, with a purge step for supplying an inert gas into the processing container and/or an evacuation step for evacuating the processing container executed between the tungsten-containing gas supply step and the hydrogen compound gas supply step.

The object described above is also achieved in another aspect of the present invention by providing a computer-readable storage medium having stored therein a program enabling a computer to execute tungsten film formation processing on a processing target material placed in an evacuatable processing container by controlling a film forming apparatus comprising the evacuatable processing container, a stage disposed within the processing container on which the processing target material is placed, a heating means for heating the processing target material and a gas supply means capable of supplying at least a silicon/hydrogen containing gas, a tungsten-containing gas and a hydrogen compound gas with no silicon content into the processing container. The tungsten film formation processing includes a silicon-containing gas supply process in which a silicon-containing gas is supplied to the processing target material via the gas supply means and a first tungsten film formation process executed after the silicon-containing gas supply process, in which the a tungsten film is formed by alternately executing multiple times; a tungsten-containing gas supply step for supplying the tungsten-containing gas via the gas supply means and a hydrogen compound gas supply step for supplying the hydrogen compound gas with no silicon content via the gas supply means, with a purge step for purging the processing container by supplying an inert gas therein and/or an evacuation step for evacuating the processing container executed between the tungsten-containing gas supply step and the hydrogen compound gas supply step.

The object described above is further achieved in another aspect of the present invention by providing a semiconductor device that includes a contact plug formed through a method implemented within an evacuatable processing container and comprising a silicon-containing gas supply process in which a silicon-containing gas is supplied to a processing target material with a contact hole formed therein, a first tungsten film formation process executed after the silicon-containing gas supply process, in which a first tungsten film is formed by alternately executing multiple times; a tungsten-containing gas supply step for supplying the tungsten-containing gas and a hydrogen compound gas supply step for supplying a hydrogen compound gas with no silicon content, with a purge step for supplying an inert gas into the processing container and/or an evacuation step for evacuating the processing container executed between the tungsten-containing gas supply step and the hydrogen compound gas supply step, a contact hole filling process in which the contact hole is filled by further forming a second tungsten film over the first tungsten film with the tungsten-containing gas and a reducing gas simultaneously supplied onto the first tungsten film, and a contact plug formation process executed after the second tungsten film is formed, in which a contact plug is formed through chemical-mechanical polishing executed at the surface of the processing target material.

Effect of the Invention

According to the present invention described above, the silicon-containing gas supply process is executed prior to the initial tungsten film formation process and in the subsequent initial tungsten film formation process, the initial tungsten film is formed by alternately supplying the tungsten-containing gas and the hydrogen compound gas with no silicon content multiple times. As a result, the specific resistance of the tungsten film, including the specific resistance of the main tungsten film to be formed subsequently, can be reduced. In addition, since the fluorine concentration over the boundary area with the barrier layer used as a base for the tungsten film is reduced, diffusion of fluorine over the barrier layer or fluorine breakthrough can be deterred. As a result, volcano formation is prevented and the adhesion of the tungsten film with the base barrier layer can be improved.

Figure 1:
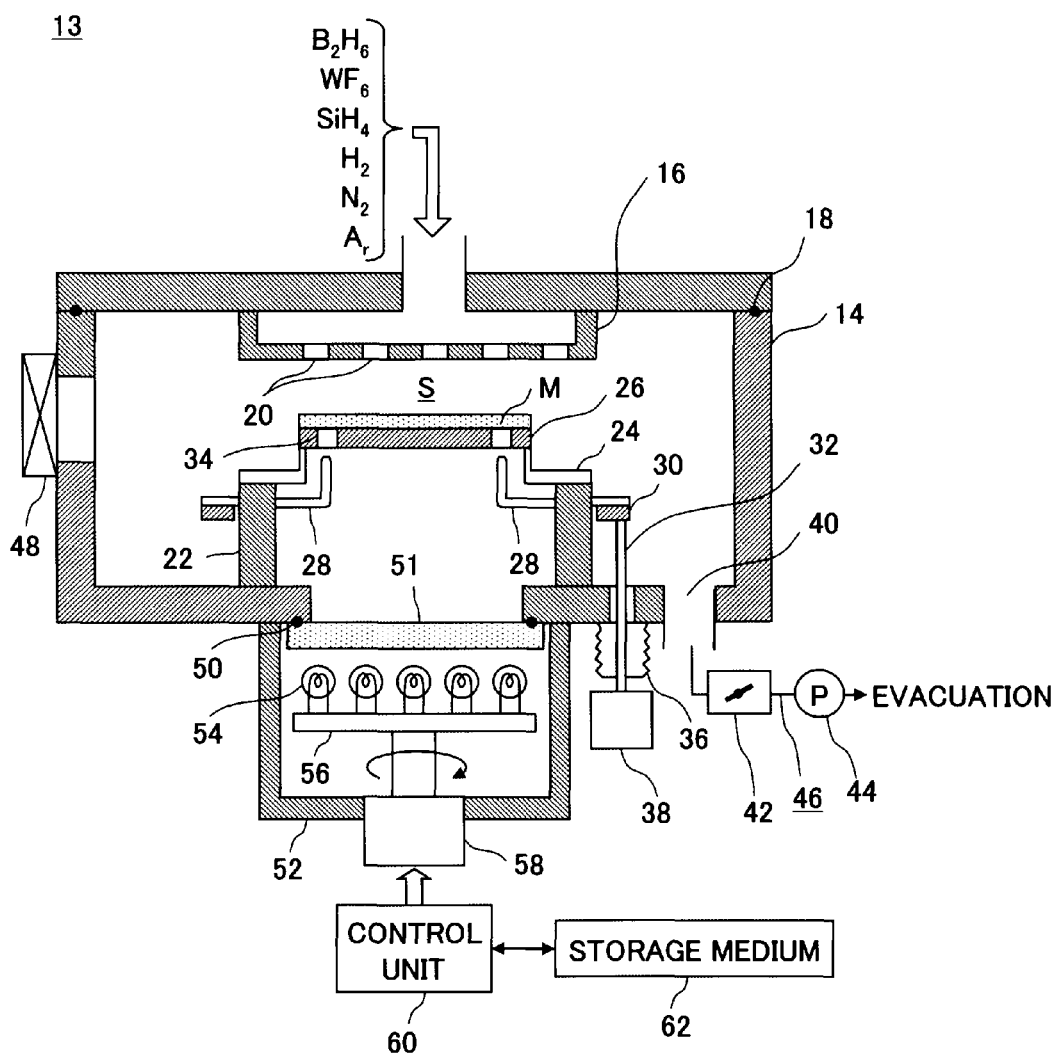
FIG. 1 The structure of a film forming apparatus adopting the tungsten film formation method achieved in an embodiment of the present invention, shown in a sectional view FIG. 2 The gas supply mode adopted when supplying the various gases during the tungsten film formation in the embodiment FIG. 3A A schematic illustration of a process of forming a tungsten film at a wafer surface FIG. 3B A schematic illustration of a process of forming a tungsten film at the wafer surface FIG. 3C A schematic illustration of a process of forming a tungsten film at the wafer surface FIG. 3D A schematic illustration of a process of forming a tungsten film at the wafer surface FIG. 3E A schematic illustration of a process of forming a tungsten film at the wafer surface FIG. 4 A graph of the specific resistance of the whole tungsten film including the initial tungsten film and the main tungsten film FIG. 5A A graph of the specific resistance of the whole tungsten film including the initial tungsten film and the main tungsten film formed through a method in the related art FIG. 5B A graph of the specific resistance of the whole tungsten film including the initial tungsten film and the main tungsten film formed through the method according to the present invention FIG. 6 A graph of a fluorine concentration distribution measured along the depth of the wafer with the tungsten film formed thereupon FIG. 7 A second graph of a fluorine concentration distribution measured along the depth of the wafer with the tungsten film formed thereupon FIG. 8A A photographic image indicating formation/non-formation of volcanoes at the tungsten film formed through the method in the related art presented in place of a drawing FIG. 8B A photographic image indicating formation/non-formation of volcanoes at the tungsten film formed through the method according to the present invention presented in place of a drawing FIG. 9A Results of evaluation of the adhesion of the laminated film constituted with the initial tungsten film and the main tungsten film, formed over the barrier layer through the method in the related art FIG. 9B Results of evaluation of the adhesion of the laminated film constituted with the initial tungsten film and the main tungsten film, formed over the barrier layer through the method according to the present invention FIG. 10A A schematic illustration of the mechanism of volcano formation FIG. 10B A schematic illustration of the mechanism of volcano formation FIG. 10C A schematic illustration of the mechanism of volcano formation FIG. 11A An example of a gas supply mode that may be adopted when supplying the various gases during tungsten film formation in the related art FIG. 11B Another example of a gas supply mode that may be adopted when supplying the various gases during tungsten film formation in the related art FIG. 12A A schematic illustration of a process executed to embed an embedment hole with a tungsten film formed by adopting the gas supply mode shown in FIG. 11A FIG. 12B A schematic illustration of a process executed to embed an embedment hole with a tungsten film formed by adopting the gas supply mode shown in FIG. 11A FIG. 12C A schematic illustration of a process executed to embed an embedment hole with a tungsten film formed by adopting the gas supply mode shown in FIG. 11A FIG. 13 A photographic image of volcano formation occurring when the tungsten film is deposited through a method in the related art, obtained via an electron microscope

EXPLANATION OF REFERENCE NUMERALS 13 film forming apparatus
14 processing container
16 showerhead unit (gas supply means)
18 seal member
20 gas injection holes
22 reflector
24 holding member
26 stage
28 lifter pin
30 ring member
32 lifter rod
34 lifter pin hole
36 bellows
38 actuator
40 discharge port
42 pressure control valve
46 evacuation system
48 gate valve
50 seal member
51 transmitting window
52 heating lamp chamber
54 heating lamp (heating means)
56 rotary base
58 rotary motor
60 control unit
62 storage medium
72 contact hole
74 barrier layer
76 decomposition intermediate
80 initial tungsten film (first tungsten film)
82 main tungsten film (second tungsten film)
83 contact plug
M wafer (processing target material)

MODE FOR CARRYING OUT THE INVENTION

The following is a detailed explanation of the best mode for carrying out the present invention given in reference to the attached drawings. It is to be noted that in the description and the drawings, the same reference numerals are assigned to components having substantially identical functions and structural features to preclude the necessity for a repeated explanation thereof.

(Structural Example for the Film Forming Apparatus)

FIG. 1 shows the structure of a film forming apparatus that may adopt the tungsten film formation method achieved in an embodiment of the present invention in a sectional view. As shown in FIG. 1, the film forming apparatus 13 includes an aluminum processing container 14 having, for instance, a substantially cylindrical section. A showerhead unit 16 functioning as a gas supply means for delivering various types of film formation gases, an inert gas and the like, to be used as processing gases, into the processing container 14 at controlled flow rates simultaneously or selectively, is installed at the ceiling inside the processing container 14 via a seal member 18 such as an O-ring. The film formation gases are thus injected toward a processing space S through numerous gas injection holes 20 formed at the bottom surface of the showerhead unit.

The showerhead unit 16 may assume a structure that includes a single diffuser plate with a plurality of diffusion holes formed therein or a plurality of such diffuser plates so as to promote diffusion of gases delivered therein or a structure with the internal space divided into a plurality of partitioned chambers so as to separately inject gases delivered into the individual chambers toward the processing space S. The showerhead unit should adopt the optimal structure in correspondence to the types of gases used in the film forming apparatus. While $B_2H_6$ (diborane) gas, $WF_6$ gas, $SiH_4$ (monosilane) gas, $H_2$ gas, $N_2$ gas, Ar gas and the like may be used as processing gases, the flow rate of each gas is independently controlled via a flow rate controller (not shown) such as a mass flow controller and the start/stop of the gas supply can be individually controlled as well. It is to be noted that the $B_2H_6$ gas may be generated by diluting the gas to a 5% content by using $H_2$ as a diluting gas (base gas).

A stage 26 on which the processing target material, i.e., a wafer M, is placed is installed via three L-shaped holding members 24 (FIG. 1 shows only two of them) on top of the cylindrical reflector 22 extending operate from the bottom of the processing container.

Under the stage 26, a plurality of L-shaped lifter pins 28, e.g., three (only two are shown in the figure), are disposed so as to range upward, with the bases of the lifter pins 28 all connected to a ring member 30 through longitudinally elongated insertion holes (not shown) formed at the reflector 22. As the ring member 30 is made to move up/down via a lifter rod 32 passing through the bottom of the processing container the lifter pins 28 are pushed through lifter pin holes 34 passing through the stage 26 and, as a result, the wafer M becomes lifted up.

An expandable bellows 36 is mounted at the container bottom over the area through which the lifter rod 32 is inserted so as to sustain the inner space of the processing container 14 in an airtight state, with the lower end of the lifter rod 32 connected to an actuator 38.

In addition, a discharge port 40 is formed at the processing container 14 at a bottom edge and an evacuation system 46, which includes a pressure control valve 42 and a vacuum pump 44 disposed in sequence, is connected to the discharge port 40 so as to evacuate the processing container 14 until a specific degree of vacuum is achieved. In addition, the wafer W is carried into/out of the processing container 14 through a gate valve 48 mounted at the side wall of the processing container 14, which is opened/closed for wafer transfer.

At the container bottom directly under the stage 26, a transmission window 51 constituted of a heat ray transmitting material such as quartz is installed via a seal member 50 such as an O-ring, so as to sustain airtightness. A box-shaped heating lamp chamber 52, is formed under the transmission window so as to enclose the transmission window 51. A plurality of heating lamps 54, constituting a heating means, are mounted at a rotary base 56 that is also used as a reflecting mirror inside the heating lamp chamber 52. The rotary base 56 is caused to rotate via a rotating shaft by a rotation motor 58 installed at the bottom of the heating lamp chamber 52. Accordingly, heat rays radiated from the heating lamps 54 are transmitted through the transmission window 51 and radiate the lower surface of the thin stage 26, thereby heating the stage 26 and also indirectly heating the wafer M placed on the stage 26. Instead of the heating lamps described above, a heating means constituted with a resistance heater installed at the stage 26 may be used to heat the wafer M.

A control unit 60 constituted with, for instance, a microcomputer is provided to control the overall operations of the film forming apparatus 13. The control unit 60 executes a sequence of control operations that must be executed during film formation processing, e.g., supply start/stop control for the various types of gases, flow rate control for the various gases, wafer temperature control and pressure control. In addition, a storage medium 62 constituted with, for instance, a floppy disk (registered trademark) or a flash memory, having stored therein a program in conformance to which tungsten film formation processing to be detailed later and the like are executed by controlling the overall operations of the apparatus, is loaded in the control unit 60.

(Example of Film Forming Apparatus Operations)

Next, an example of an operation executed in the film forming apparatus structured as described above is explained. The individual operational procedures are executed in the film forming apparatus 13 based upon programs stored in the storage medium 62, as explained earlier. First, the gate valve 48 at the side wall of the processing container 14 is opened to allow a transfer arm (not shown) to carry a wafer M into the processing container 14 and as the lifter pins 28 are lifted up, the wafer M becomes supported by the lifter pins 28. The lifter pins 28 are then made to descend by lowering the lifter rod 32 and the wafer M is thus placed onto the stage 26. A barrier layer 74, which may be constituted with a TiN/Ti film to be used as the base film, will have already been formed over the surface of the wafer M including the inner surfaces of contact holes 72 such as that shown in FIG. 3A through a preliminary process. Instead of using a barrier layer 74 assuming a laminated structure, e.g., the TiN/Ti film mentioned above, a barrier layer 74 assuming a single layer structure constituted with, for instance, a TiN film may be used.

Next, a specific type of film formation gas, an inert gas and the like to be used as the processing gas are supplied from processing gas sources (not shown) at specific flow rates to the showerhead unit 16 functioning as the gas supply means by adopting the gas supply mode to be detailed later. The processing gas is then supplied into the processing container 14 with substantial uniformity through the gas injection holes 20 at the lower surface of the showerhead unit. At the same time, the internal atmosphere is sucked out through the discharge port 40, thereby evacuating the processing container 14 to achieve a desired pressure and also, the heating lamps 54 constituting the heating means, located under the stage 26, are rotationally driven so as to radiate thermal energy.

The radiated heat rays are transmitted through the transmission window 51 and then irradiate the rear surface of the stage 26, thereby heating the stage. Since the thickness of the stage 26 is extremely small, at, for instance, approximately 1 mm, as mentioned earlier, the stage becomes heated quickly and thus, the wafer M placed thereupon can be quickly heated to achieve a specific temperature. The film formation gas delivered to the wafer induces a specific chemical reaction allowing a thin tungsten film to be deposited over the entire wafer surface.

(Specific Example of Tungsten Film Formation Method)

Figure 2:
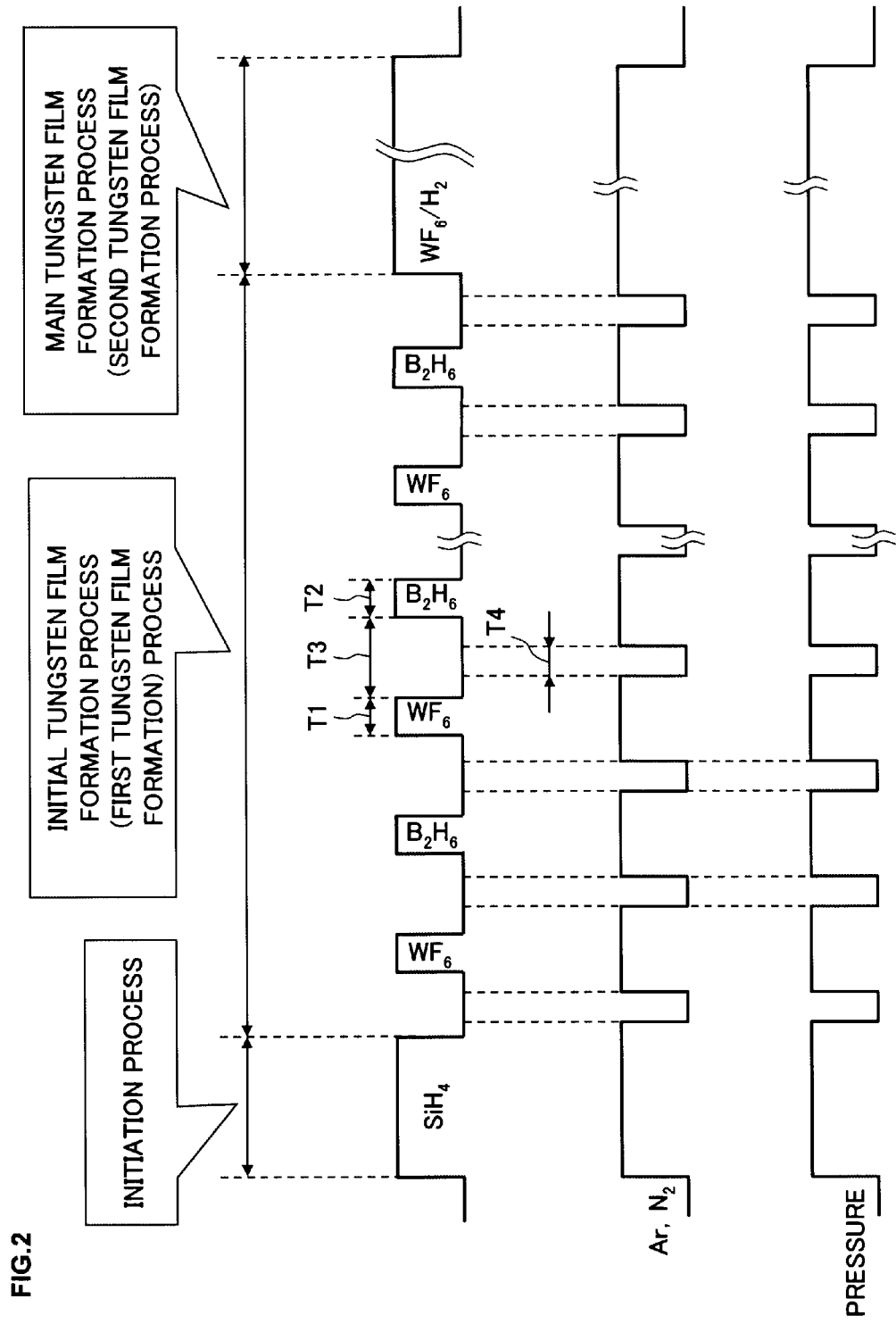

Next, the tungsten film formation method (tungsten film formation processing) achieved in the embodiment and a specific example of a supply mode that may be adopted when supplying the various gases are explained in reference to drawings. FIG. 2 illustrates the gas supply mode that may be adopted when supplying the gases, whereas FIG. 3 schematically illustrates the processes through which the tungsten film is formed at the surface of the wafer M. In the gas supply mode shown in FIG. 2, the processing container 14 is continuously evacuated while the whole sequence of film formation steps are executed and also, an inert gas, e.g., Ar gas or $N_2$ gas, is continuously supplied at a constant flow rate (or at a flow rate that is adjusted as necessary) as well as supplying $N_2$ gas to be used as a purge gas to purge the film formation gas remaining in the container as necessary.

The tungsten film formation method (tungsten film formation processing) in the embodiment comprises an initiation process executed as a pre-processing process prior to initial tungsten film formation, an initial tungsten film formation process in which an initial tungsten film, i.e., a first tungsten film, is formed and a main tungsten formation process executed after the initial tungsten film formation process, in which a main tungsten film, i.e., a second tungsten film, is formed, executed in this order.

In more specific terms, a silicon-containing gas is delivered to the space above the wafer during the initiation process in the gas supply mode shown in FIG. 2. Following the initiation process, the initial tungsten film is formed in the initial tungsten film formation process by alternately executing multiple times a tungsten-containing gas supply step for supplying a tungsten-containing gas and a hydrogen compound gas supply step for supplying a hydrogen compound gas with no silicon content with a purge step for purging or replacing the atmosphere (residual gas) in the processing container executed between the tungsten-containing gas supply step and the hydrogen compound gas supply step. Subsequently, the main tungsten film is formed by simultaneously supplying the tungsten-containing gas and a reducing gas in the main tungsten film formation process.

It is to be noted that the purge step is also executed when shifting from one process to another in order to discharge the residual film formation gas in the container. In this example, a $WF_6$ gas is used as the tungsten-containing gas, a $SiH_4$ gas is used as the silicon-containing gas and a $B_2H_6$ gas is used as the hydrogen compound gas with no silicon content. In addition, through the sequence of processes, the container is continuously evacuated and an $N_2$ gas or an Ar gas is delivered to be used as a carrier gas or a purge gas. The supply of the gases, i.e., the $N_2$ gas and the Ar gas comes to a complete halt during a middle phase T4 in the purge step. During the middle phase T4, the evacuation processing alone is continuously executed so as to eliminate the residual gas from the container substantially completely. As a result, the container internal pressure drops to the lowest level during the phase T4. The following is an explanation of the initiation process, the initial tungsten film formation process and the main tungsten film formation process given in more specific terms.

(Initiation Process)

Figure 3A:
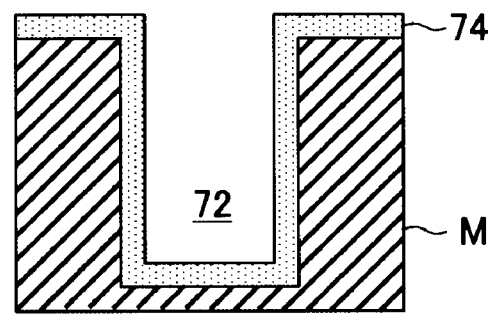
Figure 3B:
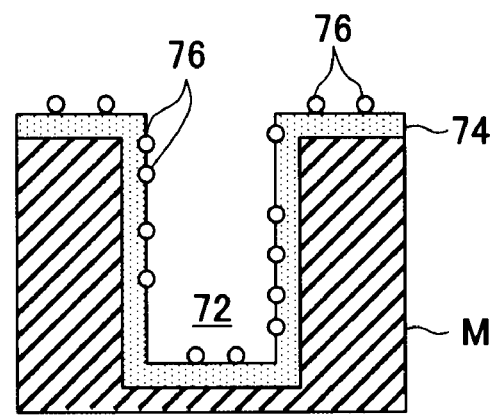

The wafer M shown in FIG. 3A undergoes the initiation process (initiation processing) which is executed as a preprocessing process. In the initiation process, the $SiH_4$, i.e. the silicon-containing gas, is continuously supplied and delivered over a specific length of time. As a result, a decomposition intermediate material 76 such as Si-, SiH-, or SiHx ($0 \leq x \leq 4$) becomes settled on the surface of the barrier layer 74 at the wafer M as shown in FIG. 3B. Through the initiation process, electro-negativity at the surface of the barrier layer 74 constituted with a TiN film or the like is improved so as to assure better adhesion with the film formation gas or the like to be delivered subsequently.

The processing conditions for the initiation process may be selected as follows. Namely, the process pressure (processing chamber internal pressure) should be set to a higher level, e.g., approximately 10666 Pa (80 Torr) than the process pressure selected for the initial tungsten film formation process executed after the initiation process. In addition, the flow rate of the $SiH_4$ gas should be set to, for instance, approximately 700 sccm in conjunction with a 300 mm wafer. The processing time length set for the initiation process should be determined in correspondence to the flow rate and the partial pressure of the $SiH_4$ gas and may be set to, for instance, 15 sec. The process temperature should be set within a range of 300° C.~400° C. and may be set to, for instance, 350° C. The process temperature may remain unchanged until the final process, i.e., the main tungsten film formation process, ends.

(Initial Tungsten Film Formation Process)

Next, the initial tungsten film formation process is executed. In the initial tungsten film formation process, the $WF_6$ gas and the $B_2H_6$ gas are alternately supplied in this order multiple times over brief periods, as described earlier, with a purge step executed between the $WF_6$ gas supply step and the $B_2H_6$ gas supply step in order to eliminate the most recently delivered gas from the container. It is desirable to promote the process of residual gas elimination by supplying an inert gas such as $N_2$ as the purge gas during the purge step.

Figure 3C:
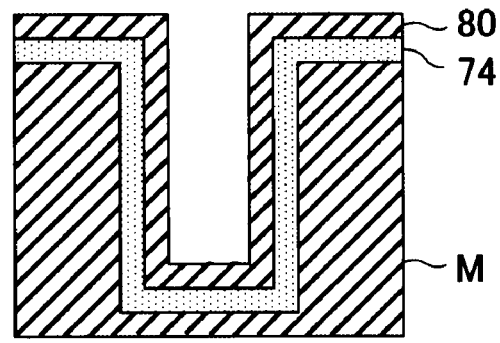

The $WF_6$ gas molecular layer settled on the wafer surface during the $WF_6$ gas supply step is reduced with the $B_2H_6$ gas supplied through the subsequent step and a tungsten film constituted with several atomic layers is formed through a single pair of gas supply steps. By repeating the alternating gas supply steps a given number of times, an initial tungsten film 80 with a desired film thickness is formed, as shown in FIG. 3C.

The flow rate of the $WF_6$ gas should be set to, for instance, approximately 160 sccm if processing a 300 mm wafer. It is to be noted that the $N_2$ gas or the Ar gas should be used as a carrier gas while supplying the $WF_6$ gas. In addition, the flow rate of the $B_2H_6$ gas may be set to, for instance, approximately 1000 sccm and Ar may be used as a carrier gas while supplying the $B_2H_6$ gas.

It is to be noted that the $B_2H_6$ gas used in the example is diluted to achieve a 5% content in the base gas constituted of $H_2$ for the following reasons. Namely, $B_2H_6$ is an unstable gas which is readily polymerized and becomes stable decaborane. Generated decaborane molecules, collecting in the supply line path, may disable stable gas supply or may lead to the formation of particles. For this reason, it is desirable to dilute the $B_2H_6$ gas by using $H_2$, which is a polymerization inhibitor, as the base gas and fill a pressure tank with the diluted $B_2H_6$ gas prior to the gas supply. The process pressure should be set to a much lower level than the process pressure set for the initiation process, e.g., to 1000 Pa or less. In addition, processing should be executed over several cycles to several tens of cycles as necessary, with a single cycle representing the period of time elapsing between a given $WF_6$ gas supply step and the immediately following $WF_6$ gas supply step.

The $WF_6$ gas supply step (tungsten-containing gas supply step) is executed over a time length Ti, which may last approximately 1.5 sec, whereas the $B_2H_6$ gas supply step (hydrogen compound gas supply step) is executed over a time length T2, which may last approximately 3 sec. The purge step lasts approximately 1.5 sec over a period T3. It is to be noted that these time lengths simply represent examples and the present invention may be adopted in conjunction with other time length settings. In addition, while the film formation rate per cycle varies depending upon the process conditions, a film formation rate of 0.7~1.2 mm is typically selected and the film thickness of the initial tungsten film is normally set to 6~7 nm. Once the initial tungsten film formation process ends, the operation shifts into the main tungsten film formation process.

(Main Tungsten Film Formation Process)

Figure 3D:
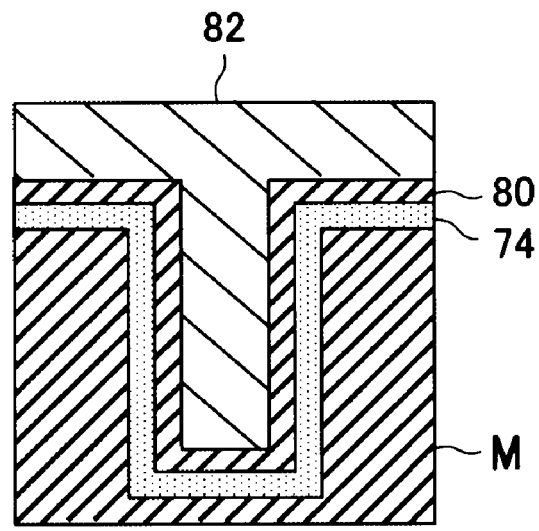

Next, the main tungsten film formation process is executed. In the main tungsten film formation process, the $WF_6$ gas and an $H_2$ gas to be used as the reducing gas are simultaneously supplied and a main tungsten film 82 is deposited at a high film formation rate through a CVD method, thereby completely filling the contact hole 72, as shown in FIG. 3D. The $WF_6$ gas flow rate set for this process should be approximately 200~300 sccm if a 300 mm wafer is being processed, and the $H_2$ gas flow rate should be set to, for instance, approximately 2200 sccm in conjunction with a 300 mm wafer. In addition, the process pressure should be set to approximately 10666 Pa. Although the film formation rate will vary depending upon the process conditions, a film formation rate of 170~240 nm/min is typically assured.

Figure 3E:
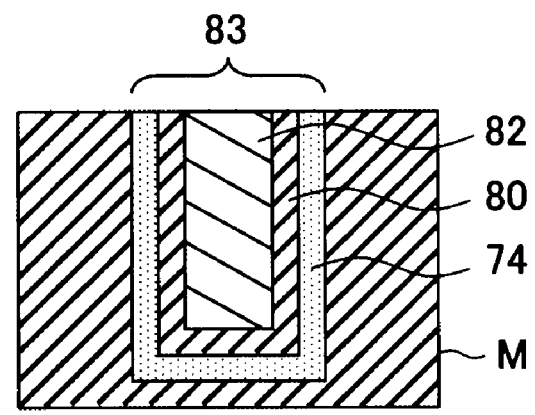

Once the main tungsten film formation process described above is completed, the wafer M is taken out of the film forming apparatus to undergo CMP (chemical-mechanical polishing) processing. As a result, a contact plug 83 is formed as shown in FIG. 3E with any excess tungsten film or barrier layer removed by planarizing the surface. Subsequently, specific processing is executed and semiconductor devices are manufactured.

(Evaluation of the Specific Resistance at the Tungsten Film)

Figure 4:
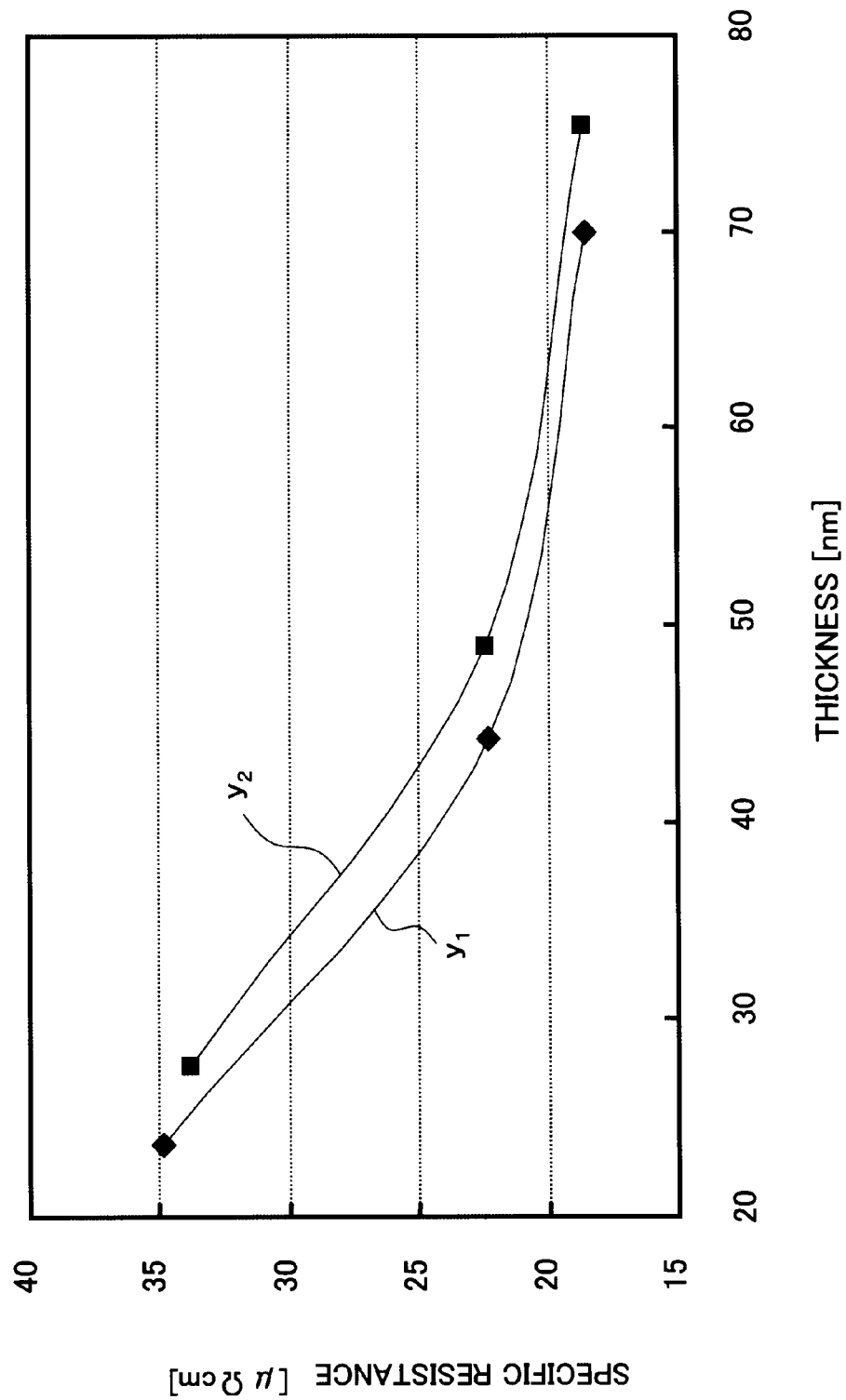

Next, the results of evaluation of the specific resistance of the entire tungsten film including the initial tungsten film and the main tungsten film, formed through the method according to the present invention described above, are explained by comparing the specific resistance to that of the entire tungsten film formed through a method in the related art. FIG. 4 presents a graph y1 of the specific resistance of the entire tungsten film formed through the method according to the present invention. In addition, FIG. 4 includes a graph y2 of the specific resistance of the entire tungsten film formed through the method in the related art. Through the method according to the present invention, the initiation process during which the $SiH_4$ gas is supplied, the initial tungsten film formation process adopting the ALD method, during which the $WF_6$ gas and the $B_2H_6$ gas are supplied alternately and the main tungsten film formation process were executed in succession. In addition, in the method in the related art, the initial tungsten film formation process adopting the ALD method during which the $WF_6$ gas and the $B_2H_6$ gas are alternately supplied and the main tungsten film formation process were executed in succession. It is to be noted that since the initial tungsten film assumes a thickness of 6~7 nm, the thickness indicated along the horizontal axis in FIG. 4 is mostly accounted for by the thickness of the main tungsten film.

As the graphs y1 and y2 clearly indicate, the specific resistance becomes lower as the thickness increases both in the tungsten films formed through the method according to the present invention and the method in the related art. However, the tungsten film formed through the method according to the present invention has a specific resistance which is invariably lower than the specific resistance of the tungsten film formed through the method in the related art with the matching thickness by approximately 1~3 μΩcm, allowing us to confirm that the specific resistance of the main tungsten film deposited on top of the initial tungsten film formed through the method according to the present invention can be lowered. The lower specific resistance may be attributable to the following. Namely, the initial tungsten film 80 used as the nucleation layer of the main tungsten film 82 becomes amorphous during the initiation process executed by supplying the $SiH_4$ gas and this amorphous state affects the growth of the main tungsten film 82. It is assumed that the specific resistance is lowered as the grain size (crystal grain diameter) of the main tungsten film 82 is maintained at a higher level compared to that of the main tungsten film 10 formed through the method in the related art.

Figure 5A:
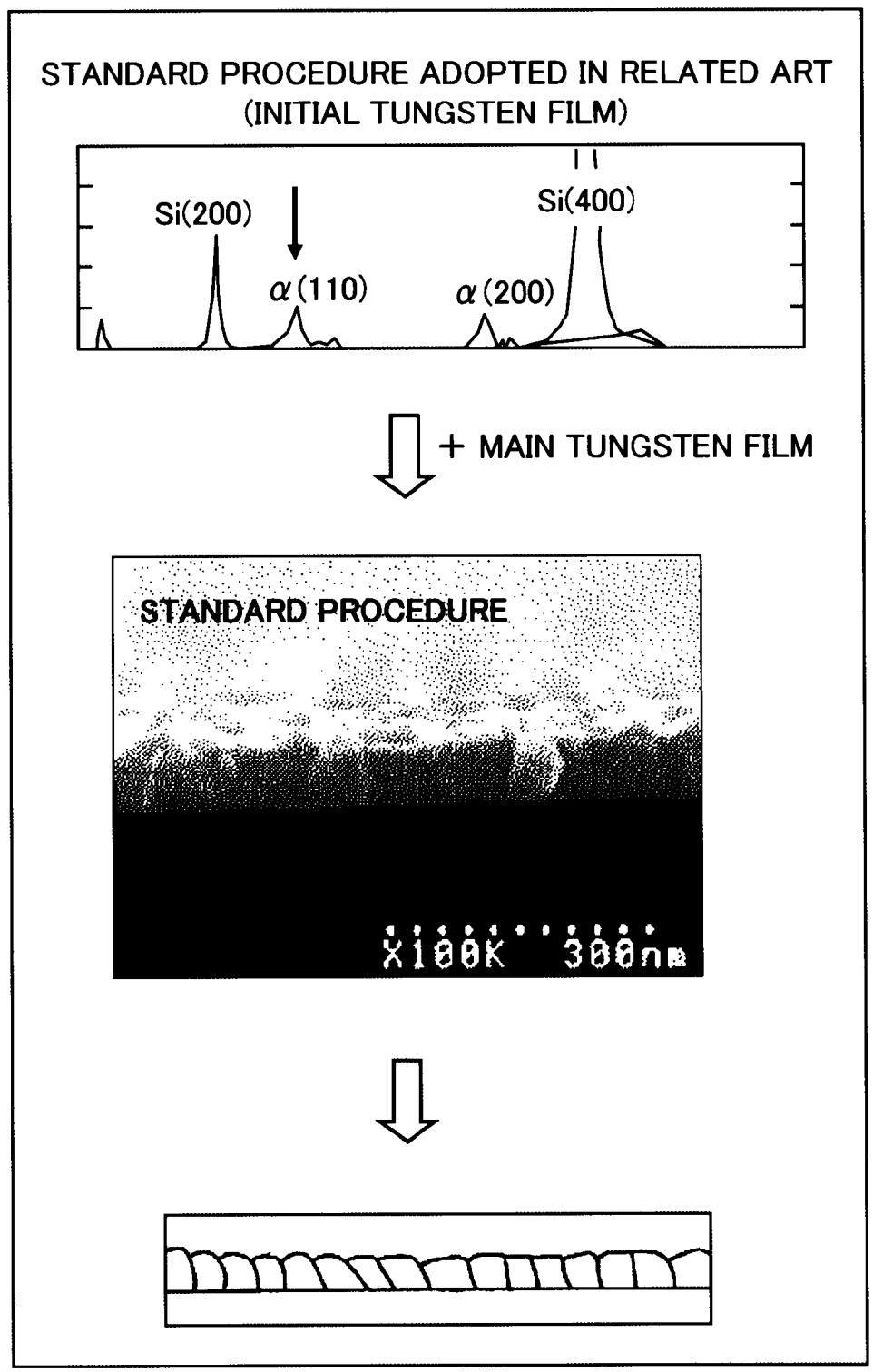
Figure 5B:
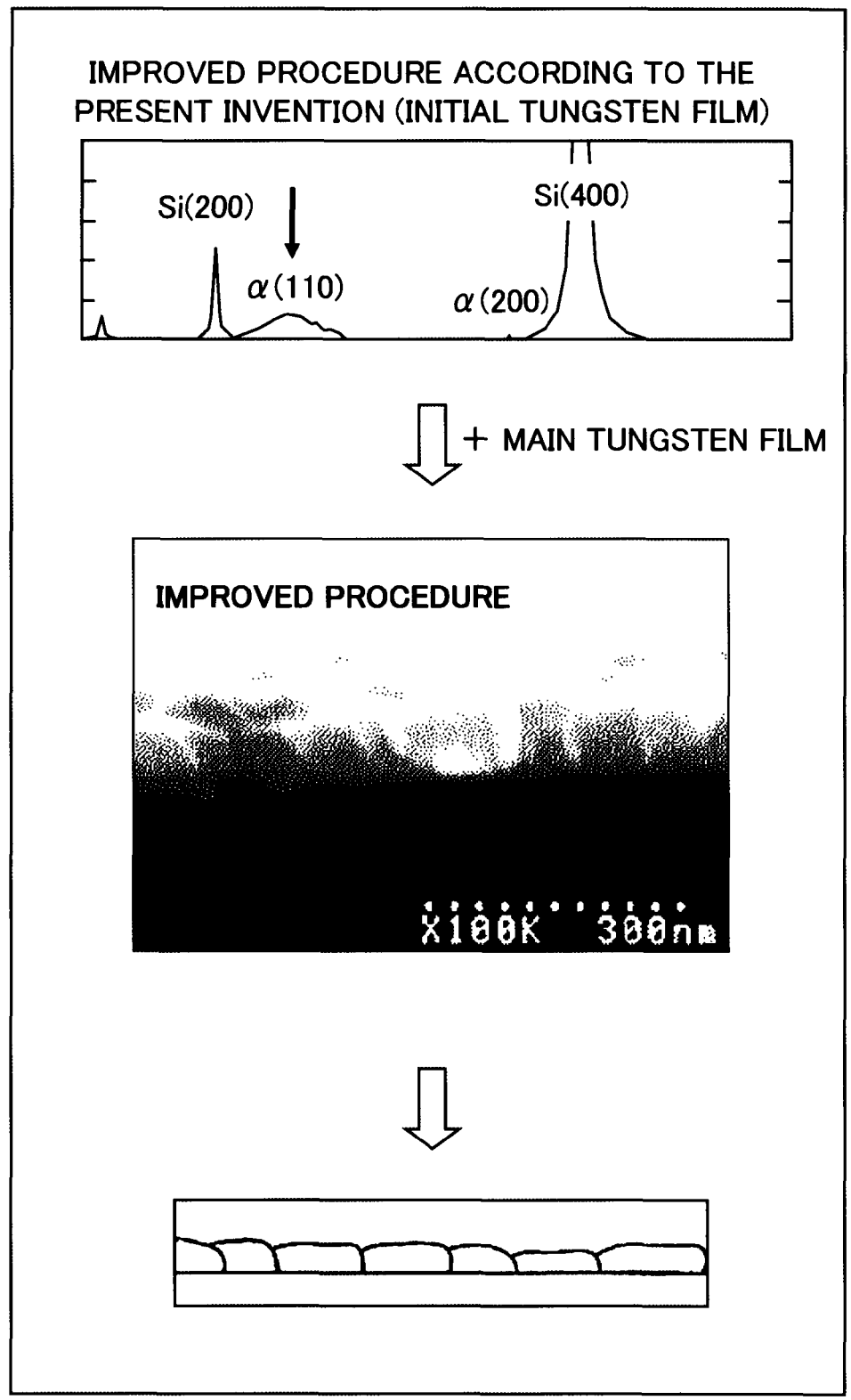

In order to substantiate this theory, sections of main tungsten films deposited over initial tungsten films with different crystalline properties were observed on an SEM (electron microscope). FIG. 5A presents the results of the x-ray diffraction analysis (XRD) executed on the initial tungsten film formed through the method in the related art and an SEM image of a section of the corresponding main tungsten film, whereas FIG. 5B presents the results of the x-ray diffraction analysis (XRD) executed on the initial tungsten film formed through the method according to the present invention and an SEM image of a section of the corresponding main tungsten film. It is to be noted that FIG. 5 includes schematic illustrations of part of the main tungsten film sections added under the individual SEM images of the sections so as to facilitate understanding. FIG. 5A corresponds to the standard procedure executed in the method in the related art, whereas FIG. 5B corresponds to the improved procedure adopted in the method according to the present invention.

In addition, Si(200) and Si(400) in the XRD results presented in FIGS. 5A and 5B are peaks indicating the substrate crystalline properties, whereas α(110) and α(200) in the XRD results in FIGS. 5A and 5B are peaks indicating the crystalline properties of the initial constant films. The results indicate that the initial tungsten film formed through the process according to the present invention is in a near amorphous state with no α(200) and a broader α(110). The results of the XRD executed on the initial tungsten films formed through the ALD also indicate that when the state of the initial tungsten film is more amorphous, the corresponding main tungsten film has larger grains (crystal grains). It is widely known that the specific resistance of a tungsten film is lowered as the grain size increases and, accordingly, the overall specific resistance of the tungsten film formed through the improved procedure adopted in the method according to the present invention is lower than the specific resistance of the tungsten film formed through the standard procedure adopted in the related art.

(Fluorine Concentration Evaluation)

Figure 6:
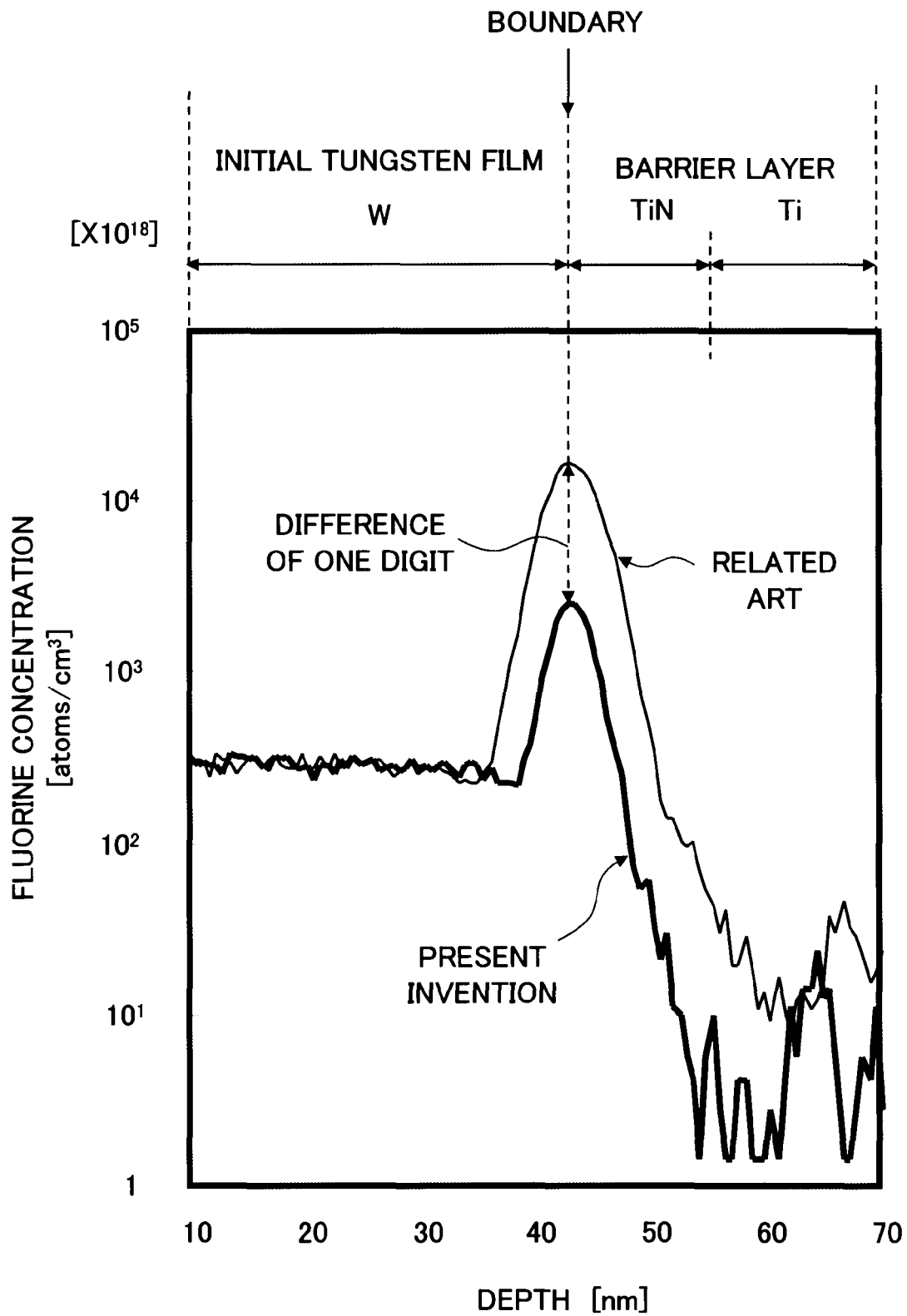

Next, the results obtained by evaluating the fluorine concentration in the boundary between the tungsten film and the barrier layer are explained. FIG. 6 presents the results obtained by measuring the distribution of fluorine concentration along the depth of the wafer with the tungsten film formed thereupon through SIMS (secondary ion mass spectrometry). In order to ascertain the difference in the boundary area fluorine concentration with more clarity, the evaluation was executed by forming initial tungsten films over a film thickness approximately 5 times the actual film thickness of the initial tungsten films.

It is to be noted that in the initial tungsten film formation process executed for purposes of this evaluation, the purge gas was supplied at a constant flow rate and at a constant pressure during the purge step executed between the alternate supplies of the $WF_6$ gas and the $B_2H_6$ gas. As FIG. 6 clearly indicates, the fluorine concentration at the boundary of the tungsten film formed according to the present invention and the barrier layer is lower by a factor of 10 than the fluorine concentration measured over the boundary area of the tungsten film formed through the method in the related art and the barrier layer, and thus it was confirmed that better results could be achieved through the method according to the present invention.

Figure 8A:
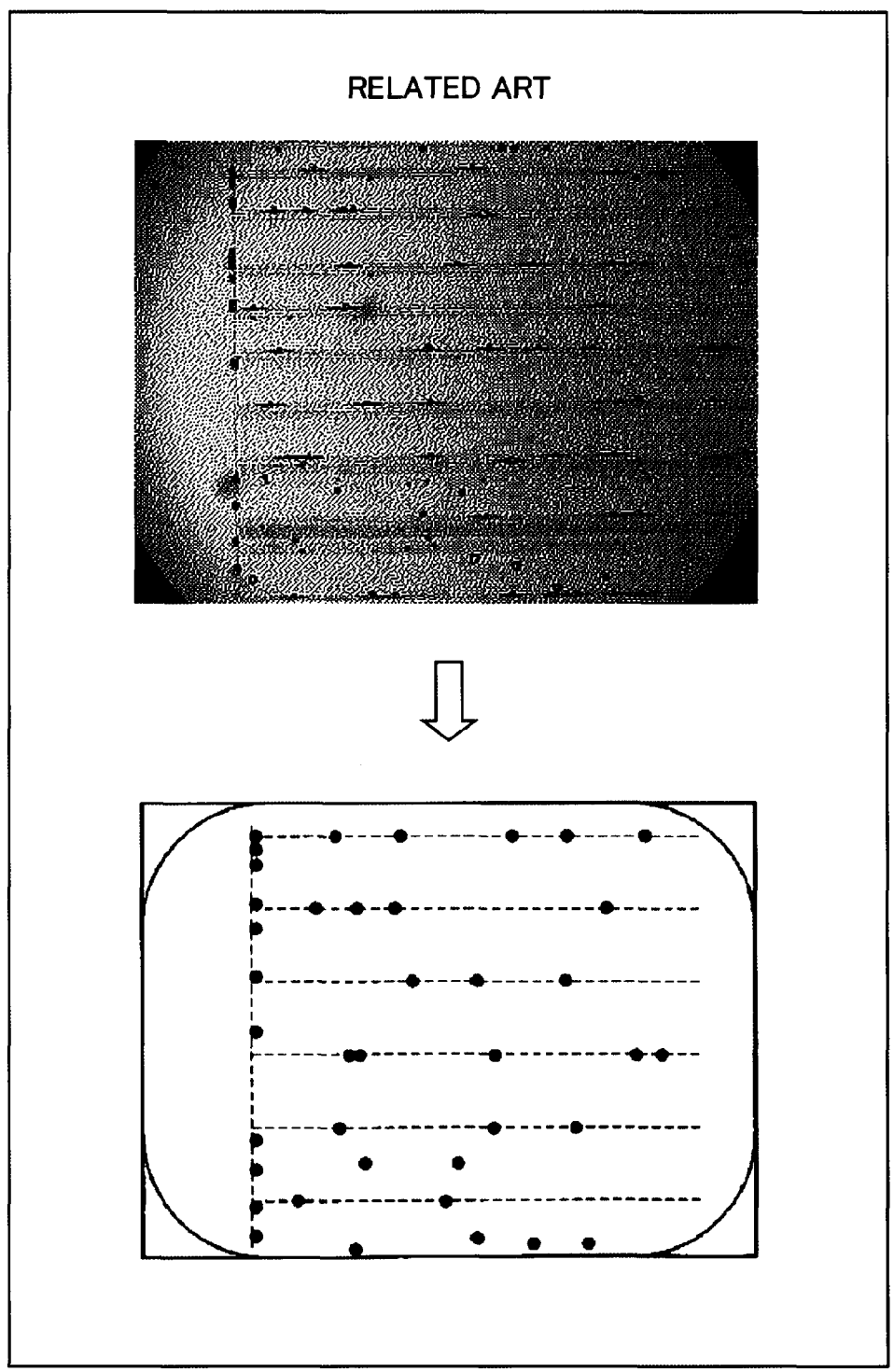
Figure 8B:
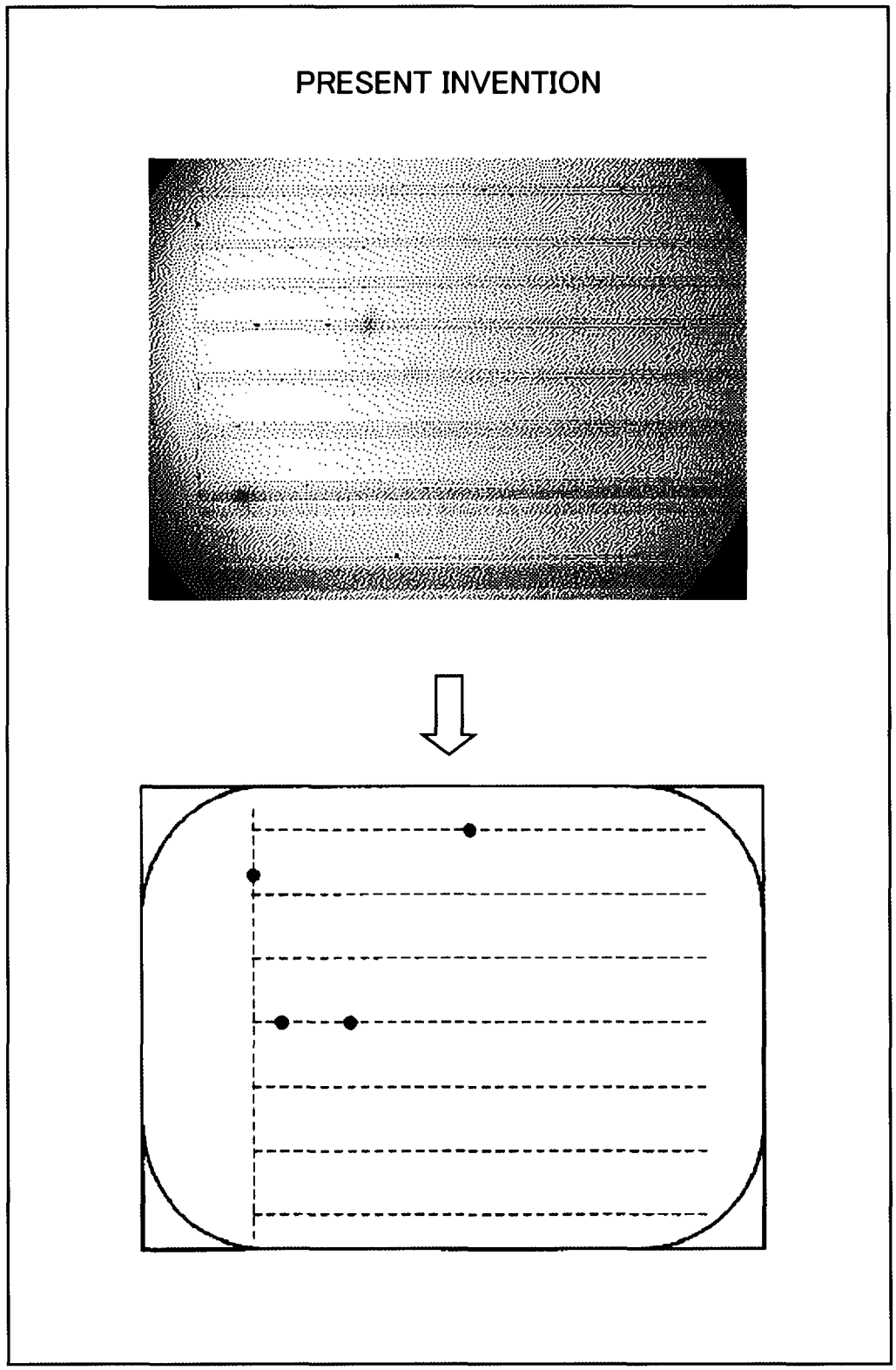

FIGS. 8A and 8B each present a photographic image of volcano formation over the entire substrate surface observed through an optical microscope. FIG. 8A shows a wafer processed through the method in the related art, whereas FIG. 8B shows a wafer processed through the method according to the present invention. FIGS. 8A and 8B each include a schematic illustration to clearly demonstrate the advantage of the present invention. The black dots in FIGS. 8A and 8B each indicate the formation of a volcano, and while numerous volcanoes were formed at the wafer formed through the method in the related art (FIG. 8A), hardly any volcanoes were formed at the wafer produced through the method according to the present invention (FIG. 8B), proving the efficacy of the method according to the present invention.

As described above, the fluorine concentration over the boundary of the tungsten film and the barrier layer can be reduced through the $SiH_4$ initiation processing, which, in turn, inhibits volcano formation and the like by deterring fluorine diffusion toward the barrier layer side and occurrence of breakthrough.

Figure 7:
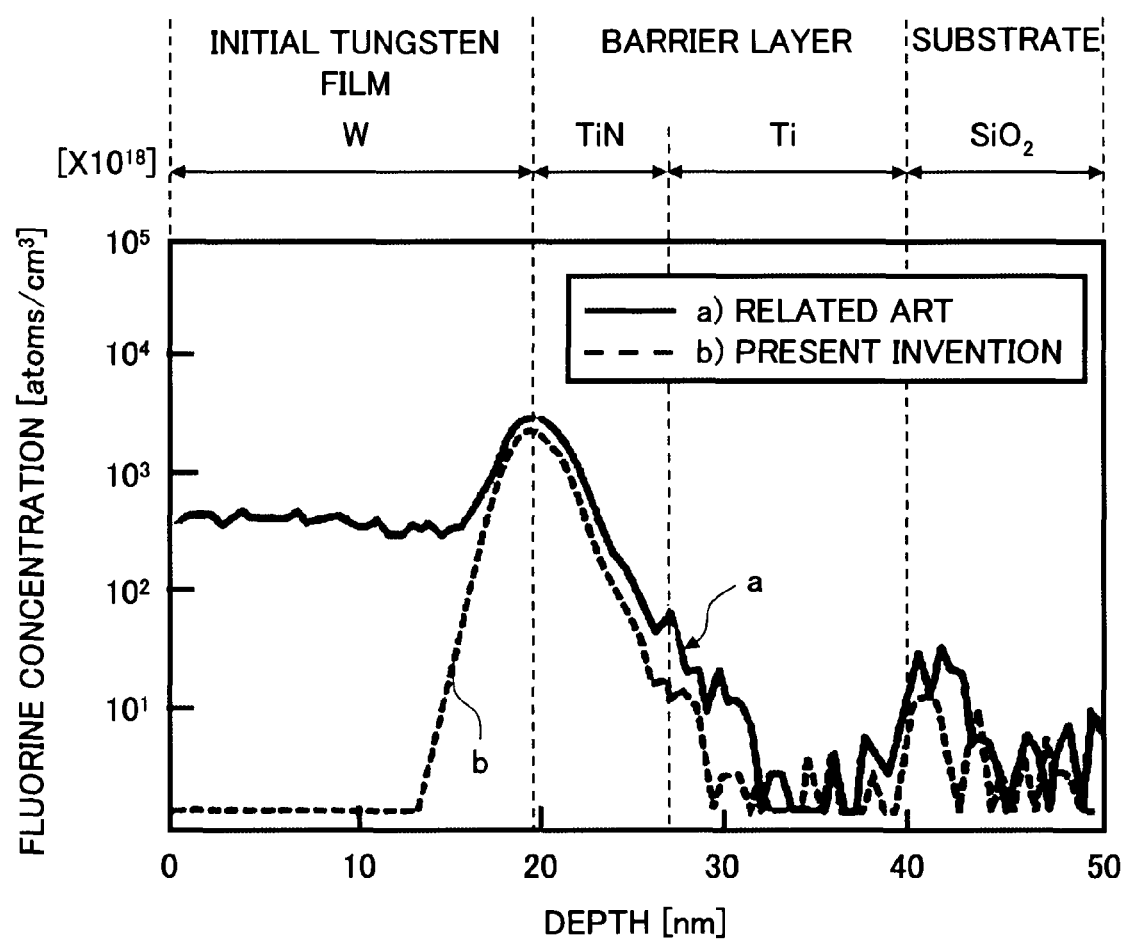

Next, the change occurring in the fluorine concentration in the initial tungsten film was evaluated in relation to a specific purge gas supply mode adopted in the initial tungsten film formation process. While the Ar gas and the $N_2$ gas are supplied at constant flow rates during the purge step executed between the alternate supplies of $WF_6$ gas and $B_2H_6$ gas in the initial tungsten film formation process executed for purposes of the evaluation described earlier, the supplies of the Ar gas and the $N_2$ gas were instead completely halted during a period T4 (see FIG. 2) substantially halfway through the purge step. During this interruption in the gas supplies, the processing container was simply evacuated to quickly lower the pressure inside. This method greatly improves the efficiency with which the residual gas is eliminated, which, in turn, inhibits the gas phase reaction between the $WF_6$ gas and the $B_2H_6$ gas so as to allow the $WF_6$ gas to adhere to the wafer surface and the reducing reaction induced via the $B_2H_6$ gas to take place continuously and in a more complete manner. FIG. 7 shows the fluorine concentration distribution in the initial tungsten film formed through the method described above together with the fluorine concentration distribution in the initial tungsten film formed by adopting the purge method in the related art provided for purposes of comparison. FIG. 7 indicates that the fluorine concentration in the initial tungsten film formed through the purge gas supply mode described above was lowered by a factor of 100, achieving a very significant advantage over the method in the related art.

While the fluorine concentration over the boundary of the tungsten film and the barrier layer can be decreased by supplying the $SiH_4$ gas in the initiation process prior to the initial tungsten film formation process, as described above, it was confirmed that by adjusting the purge gas supply mode during the initial tungsten film formation process, the fluorine concentration in the initial tungsten film, too, can be reduced. Consequently, volcano formation is expected to be inhibited even more effectively by adopting the method according to the present invention.

(Evaluation of Adhesion)

Figure 9A:
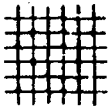
Figure 9A:
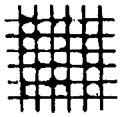
Figure 9A:
Figure 9A:
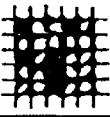
Figure 9B:
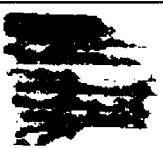
Figure 9B:
Figure 9B:
Figure 9B:
Figure 10A:
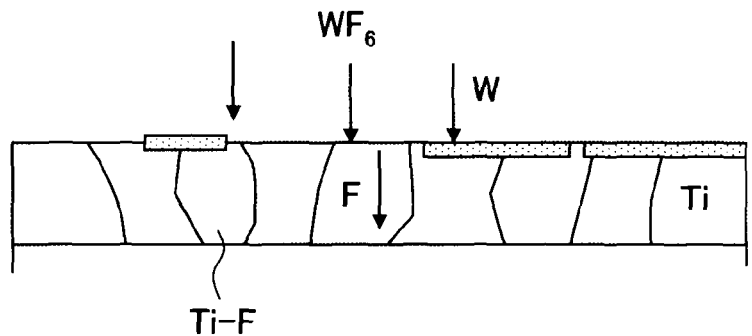
Figure 10B:
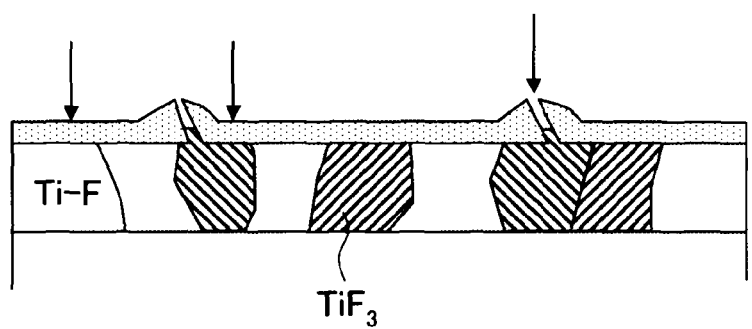
Figure 10C:
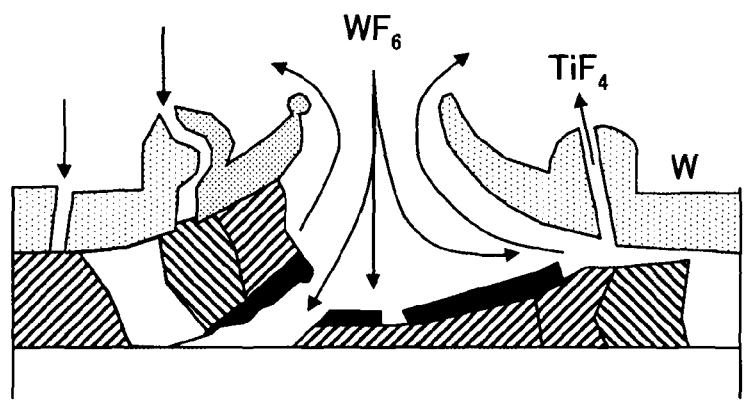
Figure 11A:
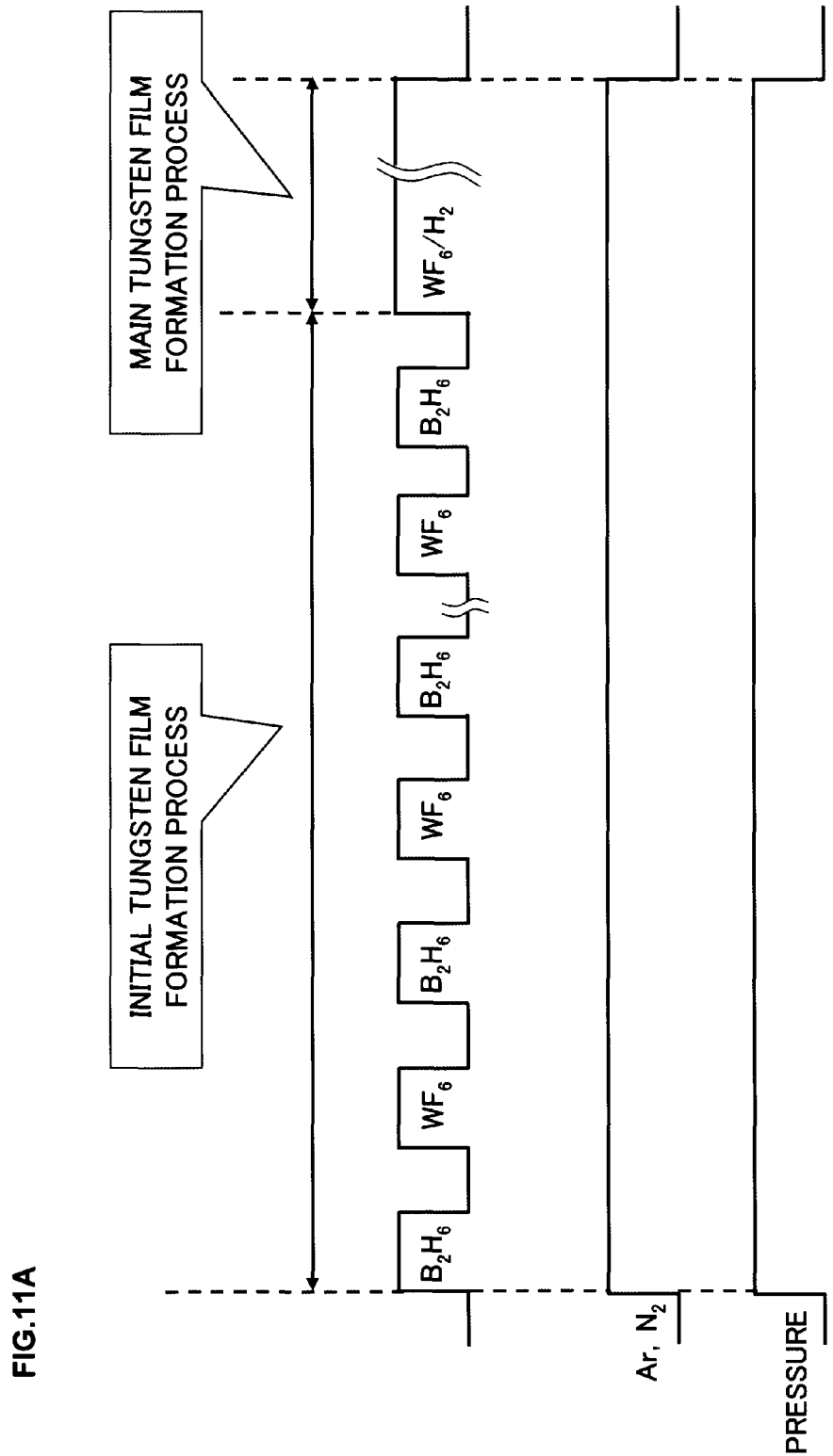
Figure 11B:
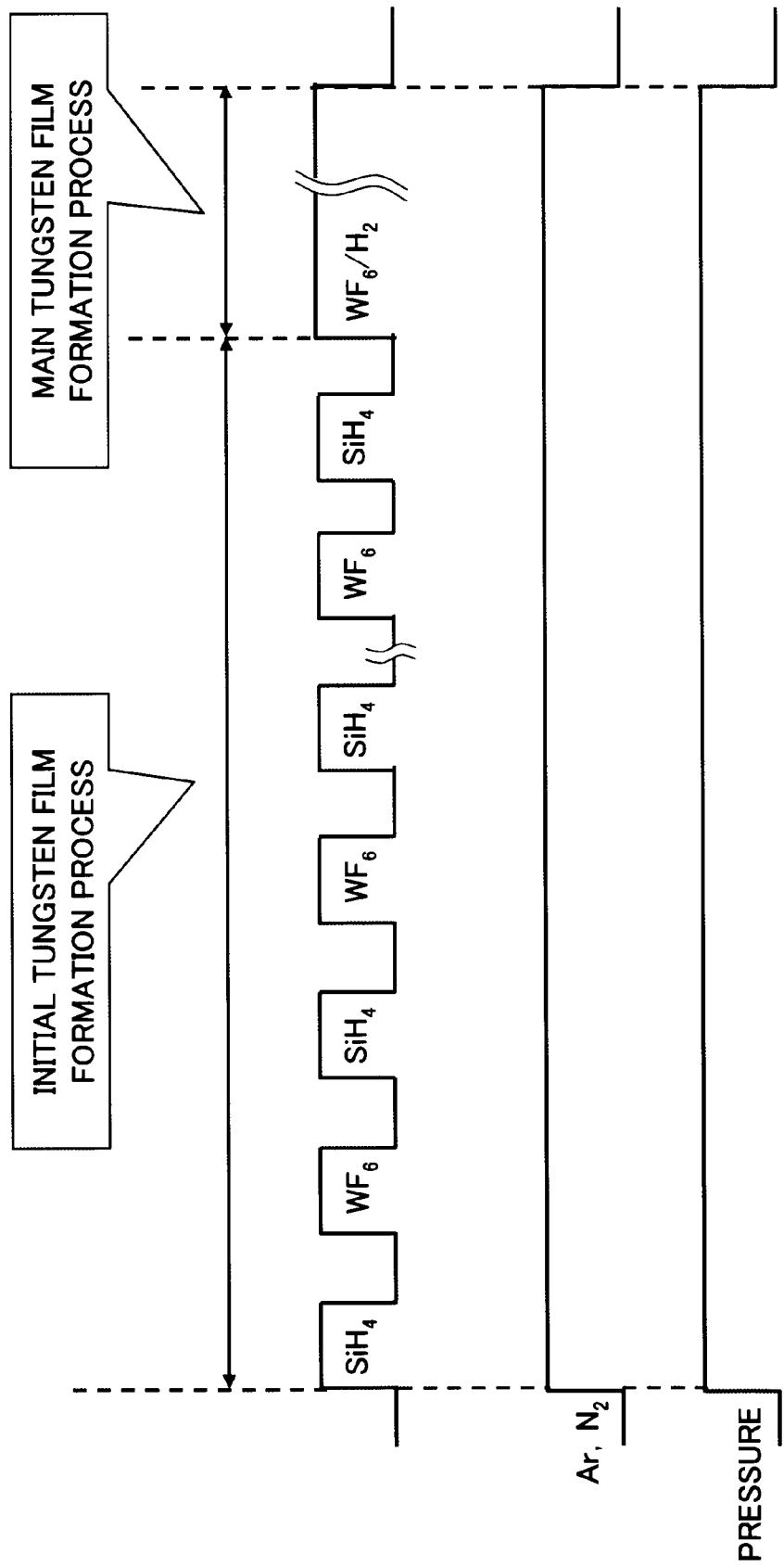
Figure 12A:
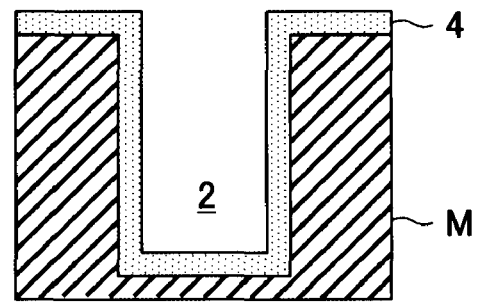
Figure 12B:
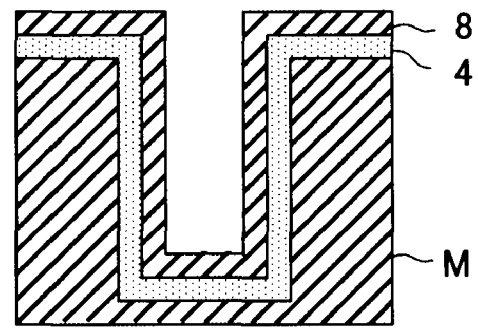
Figure 12C:
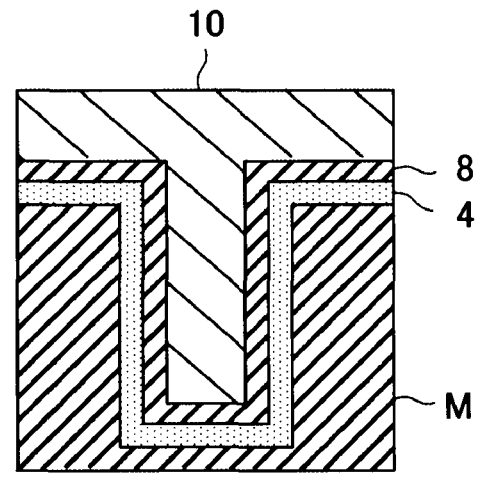
Figure 13:
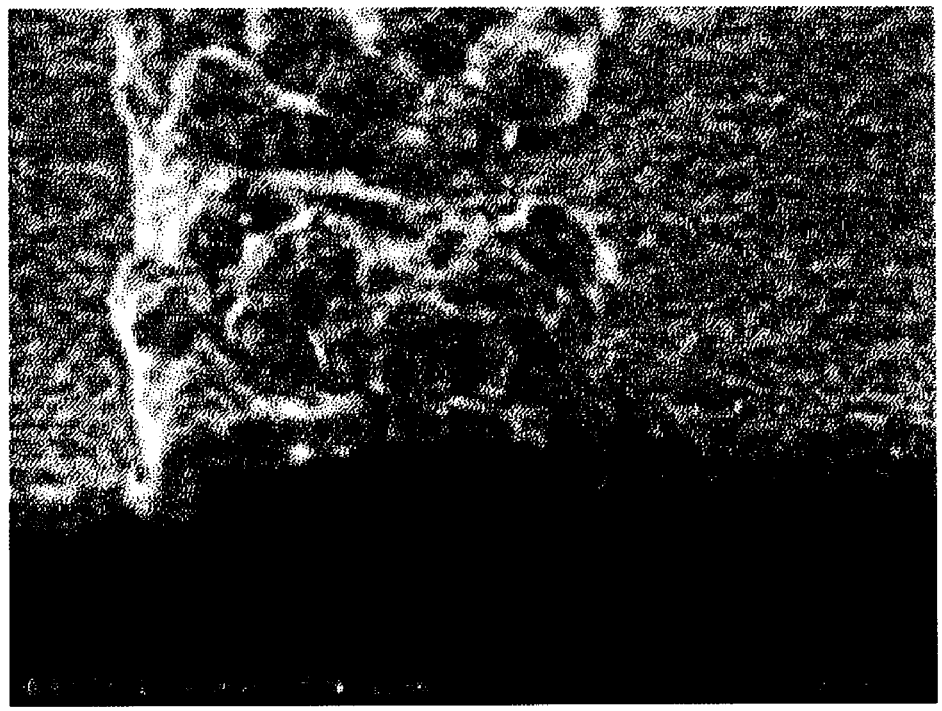

The results obtained by evaluating the level of adhesion of the tungsten film to the barrier layer based upon the JIS crosscut method (JIS k5400) are now explained. FIGS. 9A and 9B present the results of the adhesion evaluation conducted for the barrier layer and the laminated film constituted with the initial tungsten film and the main tungsten film, deposited on the barrier layer through ALD. FIG. 9A indicates the criteria applied in correspondence to the various classes into which different levels of separation are sorted in conformance to the JIS, whereas FIG. 9B indicates the levels of separation observed with regard to the tungsten films formed through the method (improved method) according to the present invention and through the method in the related art. In the adhesion evaluation method, devised based upon the JIS, specific markings running along the vertical direction and the horizontal direction in a checkerboard pattern were made on the substrate on which the tungsten film had been deposited by using a diamond pen, a specific type of Scotch tape was applied onto the surface and then the cello-tape was quickly peeled off. The rate of separation of the tungsten film was then compared with the JIS reference values to determine the adhesion level class.

The results indicate that through the $SiH_4$ initiation processing, the adhesion levels of both the initial tungsten film and the main tungsten film improved significantly. Namely, the adhesion levels of both the initial tungsten film and the main tungsten film formed through the method in the related art were significantly inferior, with the separation ratio of the initial tungsten film alone at 35~65% (1 B) and the separation ratio of the entire tungsten film including the main tungsten film at 65~100% (0 B).

In contrast, the adhesion level of the tungsten film formed according to the present invention was verified to be much better with a separation ratio of the initial tungsten film alone at 5% (1 B) or less and the separation ratio of the entire tungsten film including the main tungsten film at 35~65% (4 B). The improvement of adhesion may be attributed to recovery of the initial level of adhesion between TiN and W (tungsten) achieved through the reduction in the fluorine present at the interface between the initial tungsten film and the barrier layer, since fluorine atoms present at the interface and a fluorine compound formed through a reaction between the fluorine atoms and the barrier layer are both assumed to lower the level of adhesion between the TiN film, i.e. the barrier layer, and the tungsten film. In addition, through the improved adhesion level, an added advantage is achieved in that the solvent used in the CMP processing executed as shown in FIG. 3E is not allowed to penetrate an inner boundary area, preventing separation of the tungsten film from contact holes and the like.

While the invention has been particularly shown and described with respect to a preferred embodiment thereof by referring to the attached drawings, the present invention is not limited to these examples and it will be understood by those skilled in the art that various changes in form and detail may be made therein without departing from the spirit, scope and teaching of the invention.

For instance, while the silicon hydrogen containing gas used in the embodiment is constituted of mono-silane, the present invention is not limited to this example and a gas constituted with a silicon hydrogen compound such as di-silane or an organic silane such as tri-methyl-silane $((CH_3)_3SiH)$ may be used instead.

In addition, while the hydrogen compound gas with no silicon content used in the embodiments is constituted of diborane, the present invention is not limited to this example and a strong reducing gas such as phosphine may be used instead. Furthermore, the tungsten-containing gas may be constituted of a substance other than $WF_6$ and an organic tungsten source gas, for instance, may be used as the tungsten-containing gas.

INDUSTRIAL APPLICABILITY

The present invention may be adopted in a tungsten film formation method for forming a tungsten film at a surface of a processing target material such as semiconductor wafer, a film forming apparatus, a storage medium and a semiconductor device.

What is claimed is:

1. A tungsten film formation method for forming a tungsten film on a barrier layer formed at a surface of a processing target material in an evacuatable processing container, comprising:
   a barrier layer formation process in which a barrier layer with a uniform film thickness thereof equal to or less than 5 nm is formed upon the processing target material;
   a silicon-containing gas supply process in which $SiH_4$ as a silicon-containing gas is supplied onto said barrier layer so that a silicon decomposition intermediate material is settled on said barrier layer; and
   a first tungsten film formation process executed immediately after said silicon-containing gas supply process, in which a first tungsten film is formed by alternately executing multiple times: a tungsten-containing gas supply step for supplying $WF_6$ as a tungsten-containing gas and a hydrogen compound gas supply step for supplying hydrogen-diluted $B_2H_6$ as a hydrogen compound gas with no silicon content,
   wherein during said first tungsten film formation process, a purge step, that includes a period of time during which an inert gas is supplied into said processing container and a period of time during which said processing container is evacuated while suspending supply of the inert gas, is executed both after executing said tungsten containing gas supply step and after executing said hydrogen compound gas supply step.

2. A tungsten film formation method according to claim 1, further comprising:
   a second tungsten film formation process executed by simultaneously supplying said tungsten-containing gas and a reducing gas onto said first tungsten film.

3. A tungsten film formation method according to claim 2, wherein:

said first tungsten film formation process and said second tungsten film formation process are executed in a single processing container.

4. A tungsten film formation method according to claim 2, wherein:
said reducing gas is hydrogen.

5. A tungsten film formation method according to claim 2, wherein:
said barrier layer includes a TiN film.

6. A tungsten film formation method, comprising:
a barrier layer formation process in which a barrier layer with a uniform film thickness thereof equal to or less than 5 nm is formed upon a processing target material;
a silicon-containing gas supply process in which $SiH_4$ as a silicon-containing gas is supplied onto said barrier layer formed at the processing target material with a contact hole formed therein in an evacuatable processing container so that a silicon decomposition intermediate material is settled on said barrier layer;
a first tungsten film formation process executed immediately after said silicon-containing gas supply process, in which a first tungsten film is formed by alternately executing multiple times: a tungsten-containing gas supply step for supplying $WF_6$ as a tungsten-containing gas and a hydrogen compound gas supply step for supplying hydrogen-diluted $B_2H_6$ as a hydrogen compound gas with no silicon content;
a contact hole filling process in which a contact hole is filled by further forming a second tungsten film over said first tungsten film with said tungsten-containing gas and a reducing gas simultaneously supplied onto said first tungsten film; and
a contact plug formation process executed after said second tungsten film is formed, in which a contact plug is formed through chemical-mechanical polishing executed at the surface of the processing target material,
wherein during said first tungsten film formation process, a purge step, that includes a period of time during which an inert gas is supplied into said processing container and a period of time during which said processing container is evacuated while suspending supply of the inert gas, is executed both after executing said tungsten containing gas supply step and after executing said hydrogen compound gas supply step.

7. A semiconductor device that includes a contact plug formed through a method comprising:
a barrier layer formation process in which a barrier layer with a uniform film thickness thereof equal to or less than 5 nm is formed upon a processing target material;
a silicon-containing gas supply process in which $SiH_4$ as a silicon-containing gas is supplied onto said barrier layer formed at said processing target material with a contact hole formed therein in an evacuatable processing container so that a silicon decomposition intermediate material is settled on said barrier layer;
a first tungsten film formation process executed immediately after said silicon-containing gas supply process, in which a first tungsten film is formed by alternately executing multiple times: a tungsten-containing gas supply step for supplying $WF_6$ as a tungsten-containing gas and hydrogen-diluted $B_2H_6$ as a hydrogen compound gas supply step for supplying a hydrogen compound gas with no silicon content;
a contact hole filling process in which a contact hole is filled by further forming a second tungsten film over said first tungsten film with said tungsten-containing gas and a reducing gas simultaneously supplied onto said first tungsten film; and
a contact plug formation process executed after said second tungsten film is formed, in which a contact plug is formed through chemical-mechanical polishing executed at the surface of the processing target material,
wherein during said first tungsten film formation process, a purge step, that includes a period of time during which an inert gas is supplied into said processing container and a period of time during which said processing container is evacuated while suspending supply of the inert gas, is executed both after executing said tungsten containing gas supply step and after executing said hydrogen compound gas supply step.

* * * * *